United States Patent [19]
Ma

[11] Patent Number: 5,570,042
[45] Date of Patent: Oct. 29, 1996

[54] PECL INPUT BUFFER

[75] Inventor: Herman H. Ma, Dallas, Tex.

[73] Assignee: SGS-Thomson Microelectronics, Inc., Carrollton, Tex.

[21] Appl. No.: 368,106

[22] Filed: Jan. 3, 1995

[51] Int. Cl.[6] .............................................. H03K 19/0175
[52] U.S. Cl. ................................ 326/63; 326/68; 326/83
[58] Field of Search .................................. 326/63, 68, 73, 326/81

[56] References Cited

U.S. PATENT DOCUMENTS

| | | | |
|---|---|---|---|
| 4,980,583 | 12/1990 | Dietz | 326/68 |
| 5,105,107 | 4/1992 | Wilcox | 326/68 |
| 5,128,556 | 7/1992 | Hirakata | 326/68 X |
| 5,245,228 | 9/1993 | Harter | 326/68 |
| 5,317,214 | 5/1994 | Lewis | 326/73 X |
| 5,343,094 | 8/1994 | Nguyen | 326/68 X |
| 5,444,396 | 8/1995 | Soneda | 326/81 |

Primary Examiner—David R. Hudspeth
Attorney, Agent, or Firm—Renee M. Larson; Lisa K. Jorgenson

[57] ABSTRACT

According to the present invention, an input buffer is utilized to first amplify a differential clock or data signal pair to a desired voltage level before being presented to a CMOS or NMOS differential amplifier. In a preferred embodiment of the present invention, a PECL input buffer is comprised of a plurality of n-channel transistors which are capable of quickly amplifying the voltage level of the differential input signal pair.

23 Claims, 1 Drawing Sheet 5,570,042

PECL INPUT BUFFER

BACKGROUND OF THE INVENTION

Synchronous communications are widely used in telecommunications and other serial data applications. With the advent of teleconferencing and other multimedia applications, transmission and receipt of various data types at differing rates of speed are not so easily and efficiently handled by traditional synchronous communication devices, such as modems, which are most adept at handling transmission of serial data at a given rate of speed. For instance, multimedia applications such as teleconferences may simultaneously transmit various types of data, such as radio, audio, and video, at different rates of speed.

Asynchronous transfer mode (ATM) is often used in high speed serial data communications of approximately 100 MHz with an external clock input rate of also around approximately 100 MHz to achieve simultaneous transmission of various types of data at various rates of speed. Input serial data which is synchronous (clocked) may be stored in a handshake FIFO (First In First Out), which is capable of receiving data at one rate of speed and transmitting that data at a different rate of speed, for later transmission as an ATM frame. A handshake FIFO is needed with an ATM format because transmission of serial data may occur at any frequency. Mapping a serial data frame into an ATM frame provides the advantages of a lower overhead, an asynchronous data transfer, and a faster and more interactive operation than traditional synchronous devices such as the modem. Using ATM, for instance, a given serial data application may map an E4 frame or a sonet frame into an ATM frame.

In order to properly prepare serial data for ATM, it is desirable to work with serial data as a differential clock or data signal pair having differential voltages ranging from approximately 100 mV to 1.2 V. Differential signal pairs offer the advantage of increased noise immunity. Usually BiCMOS (Bipolar Complementary Metal Oxide Semiconductor) buffers are used to achieve a small differential voltage swing of high speed data or clock signals, with a differential clock or data signal pair known as PECL (Pseudo Emitter Common Logic) signals, but the costs associated with BiCMOS buffers at high frequencies are well known in the art. Using CMOS or NMOS technology as the alternative to BiCMOS buffers, a CMOS or NMOS differential amplifier may be directly connected to the differential clock or data signal pair. Unfortunately, a CMOS or NMOS process differential amplifier is often not fast enough at high frequencies, especially when input data are switching from an idle state to an active state at a high rate of speed. Therefore, there is an unmet need in the art to be able to compensate for the speed deficiency of a CMOS or NMOS differential amplifier at high frequencies.

SUMMARY OF THE INVENTION

It would be advantageous in the art to be able to compensate for the speed deficiency of a CMOS or NMOS differential amplifier at high frequencies.

Therefore, according to the present invention, an input buffer is utilized to first amplify a differential clock or data signal pair to a desired voltage level before being presented to a CMOS or NMOS differential amplifier. In a preferred embodiment of the present invention, a PECL input buffer is comprised of a plurality of n-channel transistors which are capable of quickly amplifying the voltage level of the differential input signal pair.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

DESCRIPTION OF THE INVENTION

Figure 1:
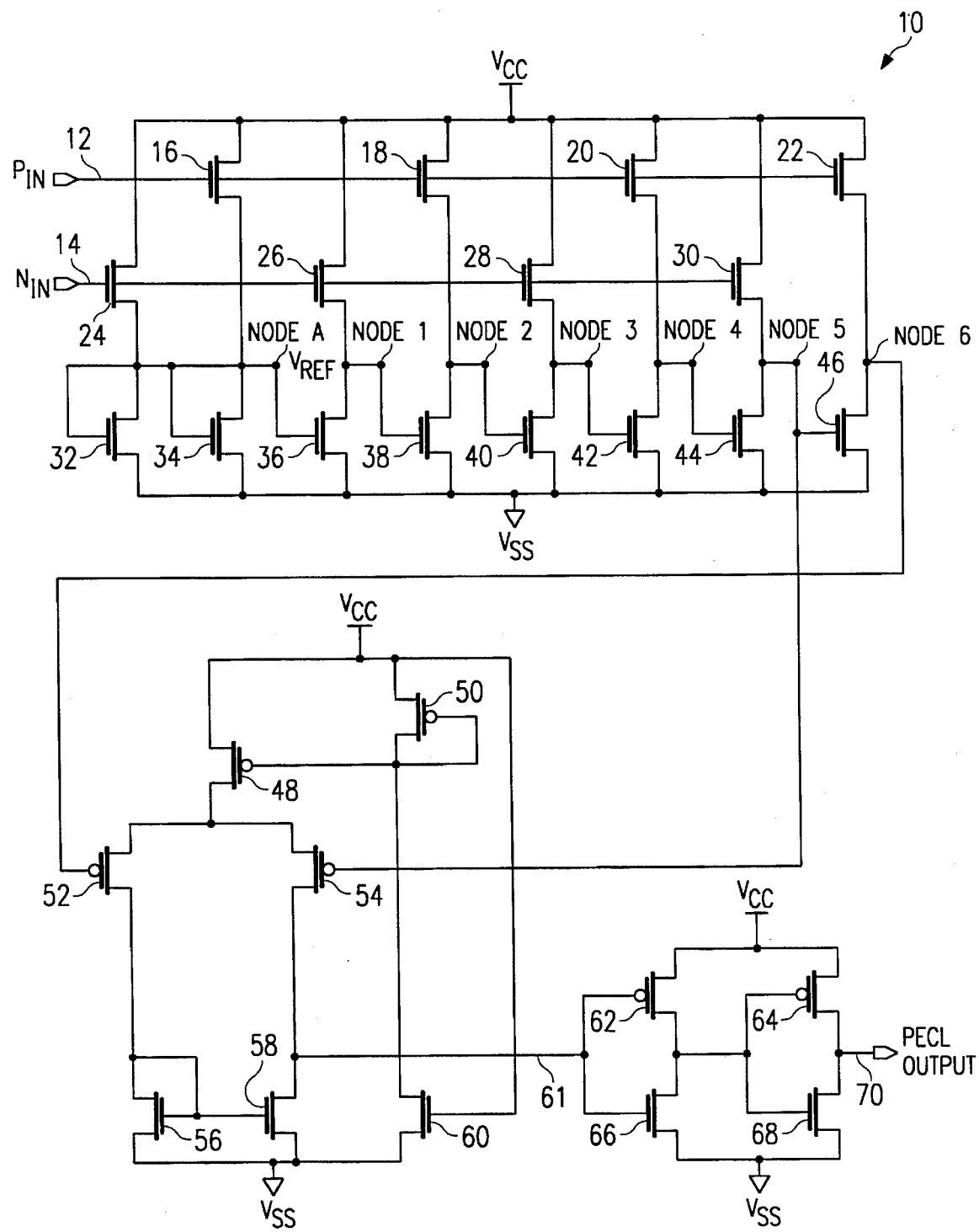
FIG. 1 is a circuit diagram of a PECL input buffer, a differential amplifier, and an output buffer, according to a preferred embodiment of the present invention.

According to the present invention, an input buffer may be used to amplify a differential clock or signal pair before being input to a CMOS or NMOS differential amplifier to obtain a small differential voltage swing. A CMOS or NMOS process differential amplifier is often not fast enough at high frequencies, especially when input data are switching from an idle state to an active state at a high rate of speed, so a preferred embodiment of the present invention uses a PECL (Pseudo Emitter-Common Logic) input buffer to the differential amplifier. Amplifying the voltage level of a differential clock or data signal pair prior to a differential amplifier allows the differential amplifier to more quickly switch between voltage levels representative of CMOS logic states, such as 0 volts (a logic "0") and 5 volts (a logic "1"). While the present invention is especially beneficial for high speed serial data or clock communications applications, the input buffer may be used with a differential clock or data signal pair having a frequency in the range of approximately 7 KHz to 200 MHz.

Referring to FIG. 1, a circuit diagram of a PECL input buffer, differential amplifier, and output buffer, according to a preferred embodiment of the present invention, is shown. The PECL input buffer is comprised of n-channel transistors 16, 18, 20, 22, 24, 26, 28, 30, 32, 34, 36, 38, 40, 42, 44, and 46. The differential amplifier is comprised of p-channel transistors 48, 50, 52, and 54 and n-channel transistors 56, 58, and 60. The differential amplifier is similar to a fast sense amplifier which is typically used for differential signal pair amplification of memory devices. The output buffer is comprised of p-channel transistors 62 and 64 and n-channel transistors 66 and 68. Differential clock or data signal pair Pin 12 and Nin 14 are high speed PECL signals which are both positive relative to ground potential.

Differential signal Pin 12 drives the gates of transistors 16, 18, 20, and 22; differential signal Nin 14 drives the gates of transistors 24, 26, 28, and 30. The gates of transistors 32, 34, and 36 are electrically connected together to define Node A. A first source/drain of transistors 16, 18, 20, 22, 24, 26, 28, 30, 48, 50, 62, and 64 are electrically connected to power supply Vcc, as shown. A first source/drain of transistors 32, 34, 36, 38, 40, 42, 44, 46, 56, 58, 60, 66, and 68, and the gate of transistor 60 are electrically connected to power supply Vss, as shown. A second source/drain of transistor 16 is electrically connected to a second source/drain of transistor 34. A second source/drain of transistor 18 is electrically connected to a second source/drain of transistor 38 and the gate of transistor 40 to define Node 1. A second source/drain of transistor 20 is electrically connected to a second source/drain of transistor 42 and the gate of transistor 44 to define Node 4. A second source/drain of transistor 22 is electrically connected to a second source/drain of transistor 46, the gate of p-channel transistor 52, a second source/drain of p-channel transistor 52, a second source/drain of transistor 56, the gate of transistor 56, and the gate of transistor 58 to define Node 6.

A second source/drain of transistor 24 is electrically connected to a second source/drain of transistor 32. A second source/drain of transistor 26 is electrically connected to a second source/drain of transistor 36 and the gate of transistor 38 to define Node 1. A second source/drain of transistor 28 is electrically connected to a second source/drain of transistor 40 and the gate of transistor 42 to define Node 3. A second source/drain of transistor 30 is electrically connected to a second source/drain of transistor 44 and the gate of transistor 54 to define Node 5.

A second source/drain of transistor 48 is electrically connected to a first source/drain of transistor 52 and a first source/drain of transistor 54. The gate of transistor 48 is electrically connected to the gate of transistor 50. A second source/drain of transistor 50 is electrically connected to a second source/drain of transistor 60. A second source/drain of transistor 54 is electrically connected to a second source/drain of transistor 58, the gate of transistor 62, and the gate of transistor 66. A second source/drain of transistor 62 is electrically connected to a second source/drain of transistor 66, a gate of transistor 64, and the gate of transistor 68 as shown. A second source/drain of transistor 64 is electrically connected to a second source/drain of transistor 68 to define PECL Output signal 70.

Because the differential amplifier is a slow amplifier, the incoming differential clock or data signal pair Pin 12 and Nin 14 are first amplified by the PECL input buffer to provide larger differential signals to the differential amplifier such that the differential amplifier may more quickly switch more quickly switch between voltage levels representative of CMOS logic states, such as 0 volts (a logic "0") and 5 volts (a logic "1"). Differential clock or data signal pair Pin 12 and Nin 14 are PECL input signals which are both positive with respect to ground; Pin 12 is a larger positive signal than Nin 14. The PECL input buffer is comprised of all n-channel transistors (transistors 16, 18, 20, 22, 24, 26, 28, 30, 32, 34, 36, 38, 40, 42, 44, and 46) such that the necessary speed enhancement of differential signal pair Pin 12 and Nin 14 may be achieved.

In the PECL input buffer, differential clock or data signal pair Pin 12 and Nin 14 develop a reference voltage Vref at Node A. Reference voltage Vref at Node A is close to the threshold voltage of any of the n-channel pull-down transistors. A decrease in the voltage of Nin signal 14 and an increase in the voltage of Pin signal 12 will cause the voltage at Node 1 to decrease, the voltage at Node 2 to increase, the voltage at Node 3 to decrease, the voltage at Node 4 to increase, the voltage at Node 5 to decrease, and the voltage at Node 6 to increase, causing a cascade amplification of differential clock or data signal pair Pin 12 and Nin 14 prior to the differential amplifier which provides the final rail to rail voltage amplification of differential clock or data signal pair Pin 12 and Nin 14. This amplification of differential clock or data signal pair Pin 12 and Nin 14 allows the differential amplifier to more quickly switch between CMOS voltage levels such as 0 volts and 5 volts. The output buffer ensures that the output signal 61 of the differential amplifier is at the proper CMOS trip point voltage, for example 2.5 volts, by amplifying output signal 61 yet again if necessary.

The input buffer of the present invention may be used to amplify any differential clock or data signal pair before being presented to a CMOS or NMOS differential amplifier. A preferred embodiment of the present invention shows and describes a PECL input buffer having a plurality of n-channel transistors for quickly amplifying the voltage level of a differential clock or data signal pair. Because a differential clock or data signal pair offers the advantage of increased noise immunity, the present invention may be used for a variety of applications where it is desirable to decrease noise reduction and RF (radio frequency) effects, especially at high operating frequencies. For example, in high speed serial data communications of approximately 100 MHz with an external clock input rate of also approximately 100 MHz, it is desirable to have the signal coming in as a differential clock or data signal pair having differential voltages which range from 100 mV to 1.2 V. As an example, it may be desirable to map an E4 frame or a sonet frame to an ATM frame, where the E4 frame and the sonet frame may each have a serial data rate of approximately 155 MHz.

While the invention has been particularly shown and described with reference to a preferred embodiment, it will be understood by those skilled in the art that various changes in form and detail may be made therein without departing from the spirit and scope of the invention. For instance one skilled in the art will understand that while CMOS circuitry has been shown and described, NMOS circuitry may be used with appropriate modifications without departing from the spirit and scope of the invention.

What is claimed is:

1. Circuitry for amplifying the voltage level of a differential clock or data signal pair, comprising:

a first differential clock or data signal pair having a first clock or data signal and a second clock or data signal;

an input buffer pre-amplifier, having a first stage, a second stage, and a third stage which has the first clock or data signal as a first input buffer input signal and the second clock or data signal as a second input buffer input signal and which produces a second clock or data signal pair having a third clock or data signal as a first input buffer output signal and a fourth clock or data signal as a second input buffer output signal, wherein the first clock or data signal and the second clock or data signal are input signals to the first stage, the second stage, and the third stage, and wherein the first stage drives the second stage and the second stage drives the third stage to cause a cascade amplification of a voltage level of the first clock or data signal and a voltage level of the second clock or data signal as reflected in a voltage level of the third clock or data signal and a voltage level of the fourth clock or data signal; and a differential amplifier which has the third clock or data signal as a first differential amplifier input signal and the fourth clock or data signal as a second differential amplifier input signal, wherein the cascade amplification of the voltage level of the first clock or data signal and the voltage level of the second clock or data signal by the input buffer pre-amplifier allows the differential amplifier to more quickly switch an output signal of the differential amplifier between a first voltage level and second voltage level.

2. The circuitry of claim 1, wherein the input buffer is an PECL input buffer and the first differential clock or data signal pair is a PECL differential clock or data signal pair.

3. The circuitry of claim 2, wherein the first clock or data signal and the second clock or data signal are each a positive voltage level with respect to a ground potential.

4. The circuitry of claim 1, wherein the input buffer is comprised of a plurality of n-channel transistors which allows the voltage level of the first clock or data signal and the voltage level of the second clock or data signal to be quickly amplified.

5. The circuitry of claim 1, wherein the circuitry is a high frequency serial data or clock communications circuitry.

6. The circuitry of claim 1, wherein the circuitry is suitable for operation from approximately 7 KHz to 200 MHz.

7. The circuitry of claim 1, wherein the differential amplifier is a fast sense amplifier typically used for differential signal pair amplification of a memory device.

8. Circuitry for amplifying the voltage level of a differential clock or data signal pair, comprising;

a first differential clock or data signal pair having a first clock or data signal and a second clock or data signal;

an input buffer which has the first clock or data signal as a first input buffer input signal and the second clock or data signal as a second input buffer input signal and which produces a second clock or data signal pair having a third clock or data signal as a first input buffer output signal and a fourth clock or data signal as a second input buffer output signal, wherein the input buffer amplifies a voltage level of the first clock or data signal and a voltage level of the second clock or data signal as reflected in a voltage level of the third clock and data signal and a voltage level of the fourth clock and data signal; and a differential amplifier which has the third clock or data signal as a first differential amplifier input signal and the fourth clock or data signal as a second differential amplifier input signal, wherein the amplification of the voltage level of the first clock or data signal and the voltage level of the second clock or data signal by the input buffer allows the differential amplifier to more quickly switch an output signal of the differential amplifier between a first voltage level and second voltage level, wherein the circuitry is a high frequency serial data or clock communications circuitry which operates at a frequency greater than approximately 100 MHz.

9. An input buffer for amplifying a differential clock or data signal pair, comprising:

a first differential clock or data signal pair having a first clock or data signal and a second clock or data signal; and an input buffer pre-amplifier, having a first stage, a second stage, and a third stage, which has the first clock or data signal as a first input buffer input signal and the second clock or data signal as a second input buffer input signal and which produces a second clock or data signal pair having a third clock or data signal as a first input buffer output signal and a fourth clock or data signal as a second input buffer output signal, wherein the first clock or data signal and the second clock or data signal are input signals to the first stage, the second stage, and the third stage, and wherein the first stage drives the second stage and the second stage drives the third stage to cause a cascade amplification of a voltage level of the first clock or data signal and a voltage level of the second clock or data signal as reflected in a voltage level of the third clock or data signal and a voltage level of the fourth clock or data signal.

10. The circuitry of claim 9, wherein the input buffer is an PECL input buffer and the first differential clock or data signal pair is a PECL differential clock or data signal pair.

11. The circuitry of claim 10, wherein the first clock or data signal and the second clock or data signal are each a positive voltage level with respect to a ground potential.

12. The circuitry of claim 9, wherein the input buffer is comprised of a plurality of n-channel transistors which allows the voltage level of the first clock or data signal and the voltage level of the second clock or data signal to be quickly amplified.

13. The circuitry of claim 9, wherein the circuitry is a high frequency serial data or clock communications circuitry.

14. The circuitry of claim 9, wherein the circuitry is suitable for operation from approximately 7 KHz to 200 MHz.

15. An input buffer for amplifying a differential clock or data signal pair, comprising:

a first differential clock or data signal pair having a first clock or data signal and a second clock or data signal; and an input buffer which has the first clock or data signal as a first input buffer input signal and the second clock or data signal as a second input buffer input signal and which produces a second clock or data signal pair having a third clock or data signal as a first input buffer output signal and a fourth clock or data signal as a second input buffer output signal, wherein the input buffer amplifies a voltage level of the first clock or data signal and a voltage level of the second clock or data signal as reflected in a voltage level of the third clock and data signal and a voltage level of the fourth clock and data signal, wherein the circuitry is a high frequency serial data or clock communications circuitry which operates at a frequency greater than approximately 100 MHz.

16. A method for amplifying the voltage level of a differential clock or data signal pair, comprising the steps of:

amplifying a voltage level of a first clock or data signal and a voltage level of a second clock or data signal, wherein the first clock or data signal and the second clock or data signal comprise a first differential clock or data signal pair of an input buffer pre-amplifier, having a first stage, a second stage, and a third stage, wherein the first differential clock or data signal pair are input signals to the first stage, the second stage, and the third stage, and wherein the first stage drives the second stage and the second stage drives the third stage to cause a cascade amplification of the voltage level of the first clock or data signal and the voltage level of the second clock or data signal as reflected in a first output signal produced by the input buffer pre-amplifier; and switching a second output signal of a differential amplifier, wherein amplifying the voltage level of the first clock or data signal and the voltage level of the second clock or data signal allows the differential amplifier to more quickly switch the second output signal of the differential amplifier between a first voltage level and a second voltage level.

17. The method of claim 16, wherein amplifying the voltage level of the first clock or data signal and the voltage level of the second clock or data signal is accomplished by the input buffer which is an PECL input buffer and the first differential clock or data signal pair is a PECL differential clock or data signal pair.

18. The method of claim 17, wherein the first clock or data signal and the second clock or data signal are each a positive voltage level with respect to a ground potential.

19. The method of claim 17, wherein the input buffer is comprised of a plurality of n-channel transistors which allows the voltage level of the first clock or data signal and the voltage level of the second clock or data signal to be quickly amplified.

20. The method of claim 17, wherein amplifying the voltage level of the first clock or data signal and the voltage level of the second clock or data signal is accomplished by the input buffer which is suitable for operation in a high frequency serial data or clock communications circuitry.

21. The method of claim 16, wherein amplifying the voltage level of the first clock or data signal and the voltage level of the second clock or data signal is accomplished by the input buffer which is suitable for operation from approximately 7 KHz to 200 MHz.

22. The method of claim 16, wherein switching a second output signal of a differential amplifier is accomplished by the differential amplifier and the differential amplifier is a fast sense amplifier typically used for differential signal pair amplification of a memory device.

23. A method for amplifying the voltage level of a differential clock or data signal pair, comprising the steps of:

amplifying a voltage level of a first clock or data signal and a voltage level of a second clock or data signal, wherein the first clock or data signal and the second clock or data signal comprise a first differential clock or data signal pair of an input buffer, and the input buffer produces a first output signal, and wherein amplifying the voltage level of the first clock or data signal and the voltage level of the second clock or data signal is accomplished by the input buffer which is suitable for operation in a high frequency serial data or clock communications circuitry which operates at a frequency greater than approximately 100 MHz; and switching a second output signal of a differential amplifier, wherein amplifying the voltage level of the first clock or data signal and the voltage level of the second clock or data signal allows the differential amplifier to more quickly switch the output signal of the differential amplifier between a first voltage level and a second voltage level.

* * * * *

REEXAMINATION CERTIFICATE (4177th)

United States Patent [19]

Ma

[11] B1 5,570,042

[45] Certificate Issued Oct. 17, 2000

[54] PECL INPUT BUFFER

[75] Inventor: Herman H. Ma, Dallas, Tex.

[73] Assignee: SGS-Thomson Microelectronics, Inc., Carrollton, Tex.

Reexamination Request:
No. 90/005,357, May 11, 1999

Reexamination Certificate for:
Patent No.: 5,570,042
Issued: Oct. 29, 1996
Appl. No.: 08/368,106
Filed: Jan. 3, 1995

[51] Int. Cl.$^7$ .............................................. H03K 19/0175
[52] U.S. Cl. ............................... 326/63; 326/68; 326/83
[58] Field of Search ...................... 326/63, 68, 73, 326/81

[56] References Cited

U.S. PATENT DOCUMENTS

| | | | |
|---|---|---|---|
| 4,386,419 | 5/1983 | Yamamoto | 365/203 |
| 5,585,743 | 12/1996 | Kenji et al. | 326/72 |
| 5,880,601 | 3/1999 | Kanazawa et al. | 326/68 |
| 5,883,910 | 3/1999 | Link | 372/38 |

FOREIGN PATENT DOCUMENTS

| | | | |
|---|---|---|---|
| 0 411 789 | 2/1991 | European Pat. Off. | ... H03K 19/0185 |
| 0 533 327 | 3/1993 | European Pat. Off. | ....... H03K 17/00 |
| 05211433 | 8/1993 | Japan | .......... H03K 19/0185 |
| WO 94 2220 | 9/1994 | WIPO | .......... H03K 19/0185 |

*Primary Examiner*—Michael J. Tokau

[57] ABSTRACT

According to the present invention, an input buffer is utilized to first amplify a differential clock or data signal pair to a desired voltage level before being presented to a CMOS or NMOS differential amplifier. In a preferred embodiment of the present invention, a PECL input buffer is comprised of a plurality of n-channel transistors which are capable of quickly amplifying the voltage level of the differential input signal pair.

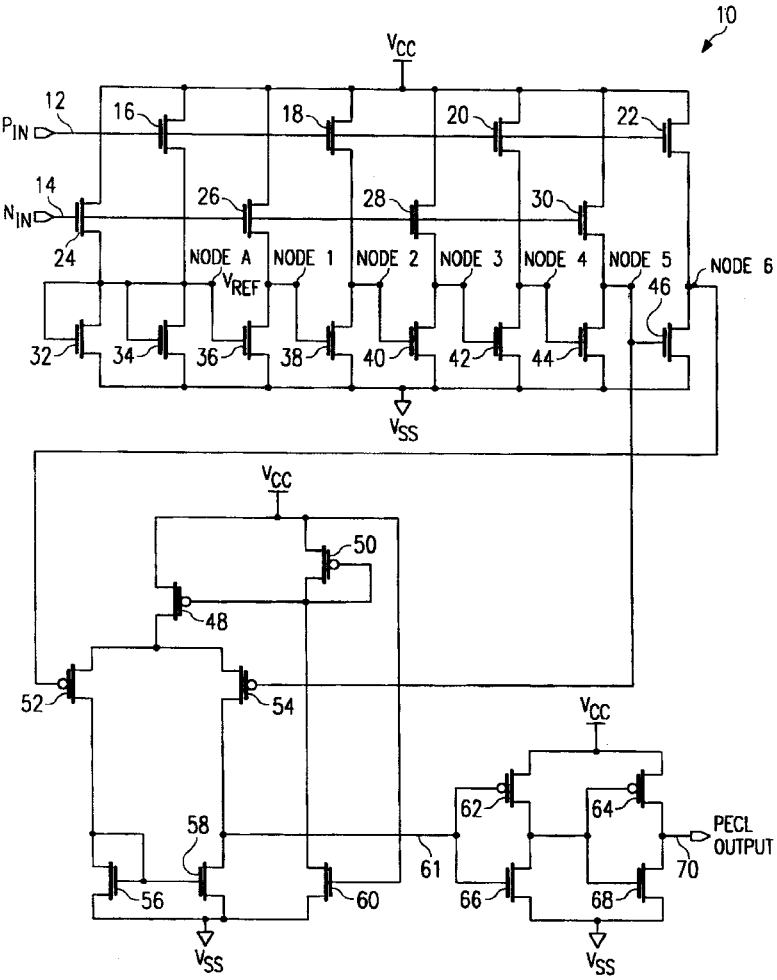

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–7, 9–14 and 16–22 is confirmed.

Claims 8, 15 and 23 are determined to be patentable as amended.

8. Circuitry for amplifying the voltage level of a differential clock or data signal pair, comprising:
  a first differential clock or data signal pair having a first clock or data signal and a second clock or data signal;
  an input buffer which has the first clock or data signal as a first input buffer input signal and the second clock or data signal as a second input buffer input signal and which produces a second clock or data signal pair havig a third clock or data signal as a first input buffer output signal and a fourth clock or data signal as a second input buffer output signal, wherein the input buffer amplifies a voltage level of the first clock or data signal and a voltage level of the second clock or data signal as reflected in a voltage level of the third clock and data signal and a voltage level of the fourth clock and data signal *and wherein the input buffer does not require an external biasing signal*; and
  a differential amplifier which has the third clock or data signal as a first differential amplifier input signal and the fourth clock or data signal as a second differential amplifier input signal, wherein the amplification of the voltage level of the first clock or data signal and the voltage level of the second clock or data signal by the input buffer allows the differential amplifier to more quickly switch an output signal of the differential amplifier between a first voltage level and second voltage level,
  wherein the circuitry is a high frequency serial data or clock communications circuitry which operates at a frequency greater than approximately 100 MHz.

15. An input buffer for amplifying a differential clock or data signal pair, comprising:
  a first differential clock or data signal pair having a first clock or data signal and a second clock or data signal; and
  an input buffer which has the first clock or data signal as a first input buffer input signal and the second clock or data signal as a second input buffer input signal and which produces a second clock or data signal pair having a third clock or data signal as a first input buffer output signal and a fourth clock or data signal as a second input buffer output signal, wherein the input buffer amplifies a voltage level of the first clock or data signal and a voltage level of the second clock or data signal as reflected in a voltage level of the third clock or data signal and a voltage level of the fourth clock or data signal *and wherein the input buffer does not require an external biasing signal*,
  wherein the circuitry is a high frequency serial data or clock communications circuitry which operates at a frequency greater than approximately 100 MHz.

23. A method for amplifying the voltage level of a differential clock or data signal pair, comprising the steps of:
  amplifying a voltage level of a first clock or data signal and a voltage level of a second clock or data signal, wherein the first clock or data signal and the second clock or data signal comprises a first differential clock or data signal pair of an input buffer, and the input buffer produces a first output signal, [and] wherein amplifying the voltage level of the first clock or data signal and the voltage level of the second clock or data signal is accomplished by the input buffer which is suitable for operation in high frequency serial data or clock communications circuitry which operates at a frequency greater than approximately 100 MHz, *and wherein the input buffer does not require an external biasing signal*; and
  switching a second output signal of a differential amplifier, wherein amplifying the voltage level of the first clock or data signal and the voltage level of the second clock or data signal allows the differential amplifier to more quickly switch the output signal of the differential amplifier between a first voltage level and a second voltage level.

* * * * *